US007193456B1

(12) United States Patent
Aude

(10) Patent No.: US 7,193,456 B1
(45) Date of Patent: Mar. 20, 2007

(54) CURRENT CONVEYOR CIRCUIT WITH IMPROVED POWER SUPPLY NOISE IMMUNITY

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 137 days.

(21) Appl. No.: 10/957,952

(22) Filed: Oct. 4, 2004

(51) Int. Cl.
*H03K 17/16* (2006.01)
*H03K 3/013* (2006.01)
(52) U.S. Cl. .................... 327/581; 327/543; 330/288
(58) Field of Classification Search ............ None
See application file for complete search history.

(56) References Cited

U.S. PATENT DOCUMENTS

| 4,008,441 | A | * | 2/1977 | Schade, Jr. | .................. 330/288 |
| 4,583,037 | A | | 4/1986 | Sooch | |
| 6,124,753 | A | * | 9/2000 | Pease | .......................... 327/538 |
| 6,542,007 | B2 | * | 4/2003 | Yoshizawa | .................. 326/120 |

* cited by examiner

*Primary Examiner*—Timothy P. Callahan
*Assistant Examiner*—Terry L. Englund
(74) *Attorney, Agent, or Firm*—Vedder, Price, Kaufman & Kammholz, P.C.

(57) ABSTRACT

A current conveyor circuit with improved power supply noise immunity. Additional biasing circuitry causes the nominal biasing potential applied to the output circuit to be increased, thereby producing a corresponding increase in the magnitude of noise voltage needed to appear on the power supply before the output signal becomes affected.

13 Claims, 1 Drawing Sheet

CURRENT CONVEYOR CIRCUIT WITH IMPROVED POWER SUPPLY NOISE IMMUNITY

BACKGROUND OF THE INVENTION

1. Field of the Invention

The present invention relates to current conveyor circuits, and in particular, to current conveyor circuits operating at low voltages with high power supply noise.

2. Description of the Related Art

Referring to FIG. 1, a conventional gain-boosting circuit, often referred to as a current conveyor circuit, includes two transistors, P-type metal oxide semiconductor field effect transistors (P-MOSFETs) M1, M2, and three current sources I1, I2, I3, all interconnected substantially as shown. Referring to FIGS. 1A and 1B, in accordance with well-known current source circuit design techniques, the upper current source I1 can be implemented using a P-type MOSFET P1 with a bias voltage Vbiasp applied at its gate electrode to generate its output current I1. Similarly, each of the lower current sources I2, I3 can be implemented as an N-type MOSFET N1 with an appropriate bias voltage Vbiasn applied at its gate electrode to generate its current output I2, I3.

In such a current conveyor circuit, an input current Iin is applied at the source electrode of transistor M1, which conveys such current to its drain electrode to be made available as the output current Iout. The circuit node at the source electrode of transistor M1 provides a low impedance path for the input current Iin, while the drain electrode of transistor M1 provides a high output impedance, thereby providing good isolation between the input (source electrode) and output (drain electrode). By including transistor M2 with its connections as shown the input impedance path for the input current Iin is reduced even further. The high impedance node at the drain electrode of transistor M2 (and gate electrode of transistor M1) and the resultant negative feedback loop can be compensated by connecting a shunt capacitance C1, e.g., between such node and the lower power supply electrode VSS/GND.

A problem arises when such a circuit is used in a large system where a significant amount of noise can appear within the power supply, particularly within the power supply reference, or ground, connection. Often such power supply noise can be quite large in magnitude as compared to the power supply voltage VDD which is often very low (e.g., 1.6 volts). As is evident from the circuit connections, the voltage V2 at the input electrode is one gate-to-source voltage VGS below the power supply voltage VDD, i.e., VDD−VGS. Accordingly, the voltage V1 at the gate electrode of the output transistor M1 is lower by one additional gate-to-source voltage VGS, i.e., VDD−2*VGS.

This makes the voltage across current source I3 also equal to VDD−2*VGS. In an integrated circuit fabricated using a typical 0.18 micron process, the threshold voltage VT of the transistors M1, M2 is approximately 0.45 volt, while the saturation voltage VDSAT of the transistors within a good region of operation is approximately 0.2 volt. With a supply voltage of 1.6 volt, this makes the voltage across current source I3 equal to VDD−2*VGS=1.6−2*0.45=1.6−1.3=0.3 volt.

If this current source I3 is a simple N-MOSFET current source (e.g., transistor N1 in FIG. 1B) operating with a minimum saturation voltage VDSAT of 0.2 volt, then it is operating with a 0.1 volt margin. However, if the power supply noise, via the ground connection VSS/GND, exceeds this margin of 0.1 volt, the device forming this current source I3 will fall out of saturation, thereby allowing the noise voltage to modulate the voltage V1 at the gate electrode of the output transistor M1. As a result, the noise becomes coupled into the output current Iout.

SUMMARY OF THE INVENTION

In accordance with the presently claimed invention, a current conveyor circuit is provided with improved power supply noise immunity. Additional biasing circuitry causes the nominal biasing potential applied to the output circuit to be increased, thereby producing a corresponding increase in the magnitude of noise voltage needed to appear on the power supply before the output signal becomes affected.

In accordance with one embodiment of the presently claimed invention, a current conveyor circuit with improved power supply noise immunity includes first and second power supply electrodes and serial circuitries. First serial circuitry is coupled between the first and second power supply electrodes, and includes input and output electrodes, a first circuit electrode and at least a first transistor. Second serial circuitry is coupled between the first and second power supply electrodes and the input electrode, and includes a second circuit electrode and at least a second transistor. Third serial circuitry is coupled between the second power supply electrode and the first and second circuit electrodes, and includes at least a third transistor.

In accordance with another embodiment of the presently claimed invention, a current conveyor circuit with improved power supply noise immunity includes first and second power supply electrodes, input and output electrodes, first and second circuit electrodes, current source circuitries and metal oxide semiconductor field effect transistors (MOSFETs). First current source circuitry is coupled between the first power supply electrode and the input electrode as a source of a first reference current. Second current source circuitry is coupled between the second power supply electrode and the output electrode as a source of a second reference current which is substantially equal to the first reference current. Third current source circuitry is coupled between the second power supply electrode and the second circuit electrode as a source of a third reference current. Fourth current source circuitry is coupled between the second power supply electrode and the first circuit electrode as a source of a fourth reference current. A first MOSFET includes first drain, source and gate electrodes coupled to the output, input and first circuit electrodes, respectively. A second MOSFET includes second drain, source and gate electrodes coupled to the second circuit, first power supply and input electrodes, respectively. A third MOSFET includes third drain and gate electrodes coupled to the first circuit electrode and a third source electrode coupled to the second circuit electrode.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
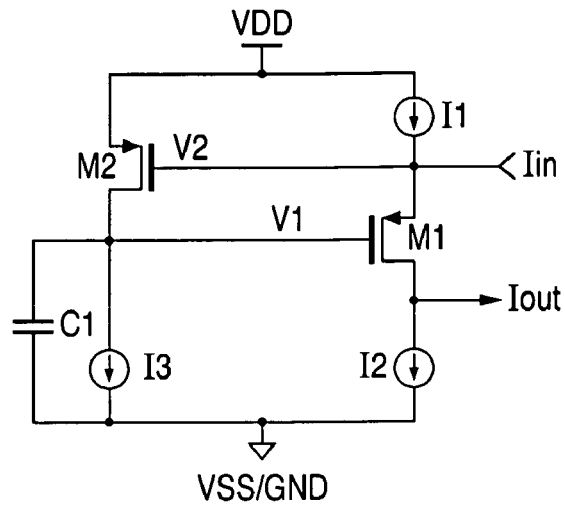
FIG. 1 is a schematic diagram of a conventional current conveyor circuit.
Figure 1A:
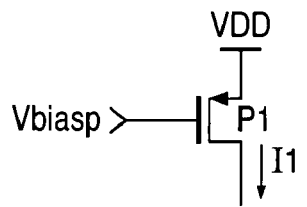
FIGS. 1A and 1B are circuit symbols for conventional implementations of current source circuits.
Figure 2:
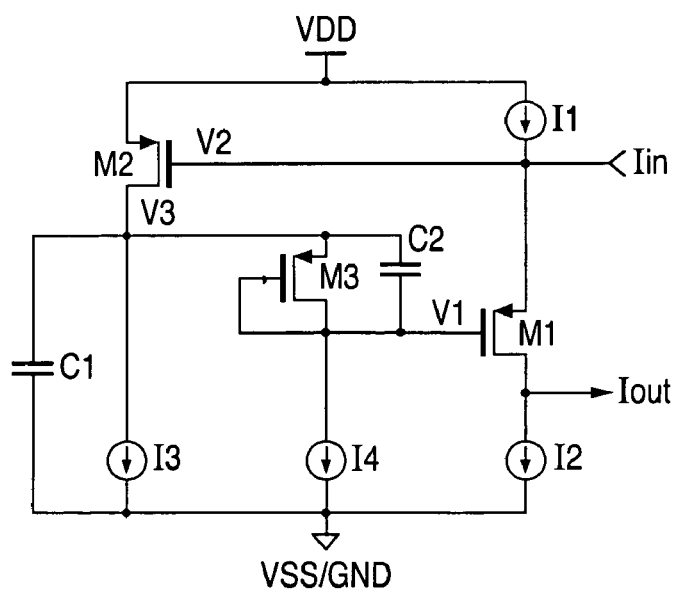
FIG. 2 is a schematic diagram of a current conveyor circuit in accordance with one embodiment of the presently claimed invention.

Referring to FIG. 2, a current conveyor circuit with improved power supply noise immunity in accordance with one embodiment of the presently claimed invention provides a modification to the conventional current conveyor circuit of FIG. 1 by adding an additional current source I4 and transistor M3, interconnected within the circuit substantially as shown. In this embodiment, the transistor M3 is a P-type MOSFET which is diode-connected with its gate and drain electrodes connected together and to the gate electrode of the output transistor M1, and with its source electrode connected to the circuit node connecting the drain electrode of transistor M2 and the upper electrode of current source I3.

In accordance with this embodiment of the presently claimed invention, transistor M3 is operated at a current density which is one-fourth (0.25) of the current densities at which transistors M1 and M2 are operated. For example, in a preferred embodiment, currents I1, I2 and I3 are equal, i.e., I1=I2=I3=IREF, while current I4 has a magnitude of one percent (1%) of the other currents, i.e., I4=0.01*IREF. Further, in such embodiment, transistors M1 and M2 have equal channel width-to-length ratios W/L with equal channel widths and lengths, while transistor M3 has a width-to-length ratio W/L of four percent (4%) of transistors M1 and M2, i.e., 0.04*W/L. As a result, transistor M3 is operated at a current density of one-fourth (¼) of the current densities of transistors M1 and M2. This causes the voltage V3 across current source I3 to now be equal to VDD-VGS-VDSAT, which is an improvement in noise immunity by a factor of VGS-VDSAT.

This can be demonstrated in accordance with well-known MOSFET circuit operating characteristics. As is well-known, drain currents ID1 and ID2 of transistors M1 and M3, respectively, can be computed based upon the majority carrier mobility u, the gate capacitance per unit area Cox, the channel width W, channel length L, threshold voltage VT, transistor scaling factor N and the respective gate-to-source voltages VGS1 (transistor M1), VGS2 (transistor M3), as follows:

Equation 1: $id_1 = \frac{u \cdot Cox}{2} \cdot \frac{N \cdot W}{L}(VGS_1 - VT)^2$ Equation 2: $id_2 = \frac{u \cdot Cox}{2} \cdot \frac{W}{L}(VGS_2 - VT)^2$ Setting these currents equal to each other (id1=id2) produces Equation 3, which can be simplified and reduced as follows, for a scaling factor of N=4:

Equation 3: $\frac{u \cdot Cox}{2} \cdot \frac{N \cdot W}{L}(VGS_1 - VT)^2 =$
$\frac{u \cdot Cox}{2} \cdot \frac{W}{L}(VGS_2 - VT)^2$

| | |
|---|---|
| $N(VGS_1-VT)^2=(VGS_2-VT)^2$ | Equation 4 |
| $\sqrt{N}(VGS_1-VT)=(VGS_2-VT)$ | Equation 5 |
| $VGS_2=\sqrt{N}(VGS_1-VT)+VT$ | Equation 6 |
| $VGS_2-VGS_1=\sqrt{N}(VGS_1-VT)+VT-VGS_1$ | Equation 7 |
| $VGS_2-VGS_1=\sqrt{N}(VGS_1-VT)-(VGS_1-VT)$ | Equation 8 |
| $VGS_2-VGS_1=(\sqrt{N}-1)(VGS_1-VT)$ | Equation 9 |
| Example: $N=4$, $VGS_2-VGS_1=(VGS_1-VT)=VDSAT_1$ | Equation 10 |

The output conductance of a MOSFET, i.e., at its drain electrode, typically has a value approximately equal to 100 times the inverse 1/GM of the transconductance GM of the device. However, when the device leaves saturation during its operation, the output impedance drops to approximately 1/GM, i.e., by a factor of 100, thereby significantly reducing the loop gain. Further, the output conductance of a MOSFET scales inversely with its output current, i.e., its drain current.

Figure 1B:
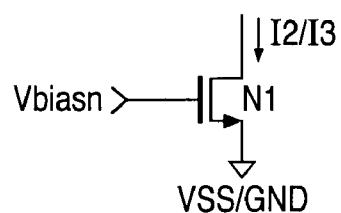

In this circuit embodiment, transistor M3 is part of a negative feedback loop where a high impedance node appears at the drain electrode of transistor M2. As noted above, this can be compensated by the shunt capacitance C1. The impedance at the drain electrode of transistor M3 will be approximately the inverse of its transconductance GM, and is very small compared to the output impedance of the current source I3, i.e., at the circuit node to which the source electrode of transistor M3 is connected. However, the device providing the output current for the current source I3 (e.g., transistor N1 in FIG. 1B) is also typically quite small and operates with a very low current. Accordingly, its output impedance, while large as compared to the impedance of transistor M3, may nonetheless be relatively low. To compensate for this, an additional capacitance C2 can be connected if necessary between the drain and source electrodes of transistor M3, and preferably have a value approximately equal to the gate-to-source capacitance CGS of the output transistor M1 so as to avoid introducing a high frequency zero into the transfer function for the feedback loop.

When the current source I4 leaves saturation during operation, e.g., due to power supply noise via circuit ground VSS/GND, the impedance seen in parallel with the output impedance of current source I3 will be the inverse 1/GM of the transconductance GM of the device forming current source I4 (e.g., transistor N1 in FIG. 1B) in series with the impedance of this added capacitance C2 (which at high frequency should be very low).

As a result, the inverse 1/GM of the transconductance GM of the device forming current source I4 will be approximately 100 times as large as the inverse 1/GM of the transconductance GM of the device forming current source I3, and is approximately equal to the output conductance GDS (the inverse of the output resistance, i.e., the drain-to-source resistance RDS) of the device forming current source I3. Accordingly, the loop gain decreases only by a factor of 2, which is an improvement by a factor of 50.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a current conveyor circuit with improved power supply noise immunity, comprising:
   first and second power supply electrodes;
   first serial circuitry coupled between said first and second power supply electrodes, and including input and output electrodes, a first circuit electrode and at least a first transistor;
   second serial circuitry coupled between said first and second power supply electrodes and said input electrode, and including a second circuit electrode and at least a second transistor; and
   third serial circuitry coupled between said second power supply electrode and said first and second circuit electrodes, and including at least a third transistor;
   wherein
      said first transistor is respective to a first reference current by operating at a first current density,
      said second transistor is responsive to a second reference current by operating at a second current density which is substantially equal to said first current density, and
      said third transistor is responsive to a third reference current by operating at a third current density which is less than said first current density.

2. The apparatus of claim 1, wherein said first and second reference currents are substantially equal.

3. The apparatus of claim 1, wherein said third reference current is less than said first reference current.

4. An apparatus including a current conveyor circuit with improves power supply noise immunity, comprising:
   first and second power supply electrode;
   first serial circuitry coupled between said first and second power supply electrodes, and including input and output electrodes, a first circuit electrode and at least a first transistor;
   second serial circuitry coupled between said first and second power supply electrodes and said input electrode, and including a second circuit electrode and at least a second transistor; and
   third serial circuitry coupled between said second power supply electrode and said first and second circuit electrodes, and including at least a third transistor
   wherein
      said first serial circuitry further includes
         first current source circuitry coupled between said first power supply electrode and said input electrode, and
         second current source circuitry coupled between said second power supply electrode and said output electrode; and
      said first transistor comprises a metal oxide semiconductor field effect transistor (MOSFET) with drain, source and gate electrodes coupled to said output, input and first circuit electrodes, respectively.

5. The apparatus of claim 4, wherein said first current source circuitry comprises at least one additional MOSFET with additional drain and source electrodes coupled to said input and first power supply electrodes.

6. The apparatus of claim 4, wherein said second current source circuitry comprises at least one additional MOSFET with additional drain and source electrodes coupled to said output and second power supply electrodes.

7. An apparatus including a current conveyor circuit with improved power supply noise immunity, comprising:
   first and second power supply electrodes;
   first serial circuitry coupled between said first and second power supply electrodes, and including input and output electrodes, a first circuit electrode and at least a first transistor;
   second serial circuitry coupled between said first and second power supply electrodes and said input electrode, and including a second circuit electrode and at least a second transistor; and
   third serial circuitry coupled between said second power supply electrode and said first and second circuit electrodes, and including at least a third transistor;
   wherein
      said second serial circuitry further includes current source circuitry coupled between said second power supply electrode and said second circuit electrode,
      said second transistor comprises a metal oxide semiconductor field effect transistor (MOSFET) with drain, source and gate electrodes coupled to said second circuit, first power supply and input electrodes, respectively, and
      said current source circuitry comprises at least one additional MOSFET with additional drain and source electrodes coupled to said second circuit and second power supply electrodes.

8. An apparatus including a current conveyor circuit with improved power supply noise immunity, comprising:
   first and second power supply electrodes;
   first serial circuitry coupled between said first and second power supply electrodes, and including input and output electrodes, a first circuit electrode and at least a first transistor;
   second serial circuitry coupled between said first and second power supply electrodes and said input electrode, and including a second a second circuit electrode and at least a second transistor; and
   third serial circuitry couples between power supply electrode and said first and second circuit electrodes, and including at least a third transistor
   wherein
      said third serial circuitry further includes current source circuitry coupled between said second power supply electrode and said first circuit electrode, and
      said third transistor comprises a metal oxide semiconductor field effect transistor (MOSFET) with drain and gate electrodes coupled to said first circuit electrode and a source electrode coupled to said second circuit electrode.

9. The apparatus of claim 8, wherein said current source circuitry comprises at least one additional MOSFET with additional drain and source electrodes coupled to said first circuit and second power supply electrodes.

10. An apparatus including a current conveyor circuit with improved power supply noise immunity, comprising:
first and second power supply electrodes;
input and output electrodes;
first and second circuit electrodes;
first current source circuitry coupled between said first power supply electrode and said input electrodes as a source of a first reference current;
second current source circuitry couples between said second power supply electrode and said output electrode as a source of a second reference current which is substantially equal to said first reference current;
third current source circuitry coupled between said second power supply electrode and said second circuit electrode as a source of a third reference current;
fourth current source circuitry coupled between said second power supply electrode and said first circuit electrode as a source of a fourth reference current;
a first metal oxide semiconductor field effect transistor (MOSFET) with first drain, source and gate electrodes coupled to said output, input and first circuit electrodes coupled to said second a second MOSFET with second drain, source and gate electrodes coupled to said second circuit, first power supply and input electrodes, respectively; and
a third MOSFET with third drain and gate electrodes coupled to said first circuit electrode and a third source electrode coupled to said second circuit electrode.

11. The apparatus of claim 10, wherein:
said first MOSFET is responsive to at least one of said first and second references currents by operating at a first current density;
said second MOSFET is responsive to said third reference current by operating at a second current density which is substantially equal to said first current density; and
said third MOSFET is responsive to said fourth reference current by operating at a third current density which is less than said first current density.

12. The apparatus of claim 11, wherein said first, second and third reference currents are substantially equal.

13. The apparatus of claim 11, wherein said fourth reference current is less than at least one of said first, second and third reference currents.

* * * * *

UNITED STATES PATENT AND TRADEMARK OFFICE
CERTIFICATE OF CORRECTION

PATENT NO.        : 7,193,456 B1                                    Page 1 of 1
APPLICATION NO. : 10/957952
DATED             : March 20, 2007
INVENTOR(S)      : Arlo Aude It is certified that error appears in the above-identified patent and that said Letters Patent is hereby corrected as shown below:

Column 5, line 50, delete "improves" and insert --improved--;

Column 5, line 51, delete "electrode" and insert --electrodes--;

Column 6, line 54, delete "couples" and insert --coupled--;

Column 6, line 54, delete "between power" and insert --between said second power--;

Column 7, line 9, delete "electrodes" and insert --electrode--;

Column 7, line 11, delete "couples" and insert --coupled--;

Column 7, line 24, delete "coupled to said second" and insert --,respectively,--; and Column 8, line 9, delete "references" and insert --reference--.

Signed and Sealed this

Fifteenth Day of May, 2007

JON W. DUDAS
*Director of the United States Patent and Trademark Office*